United States Patent [19]

Shwartzman

[11] 4,261,791

[45] Apr. 14, 1981

[54] TWO STEP METHOD OF CLEANING SILICON WAFERS

[75] Inventor: Stanley Shwartzman, Somerville, N.J.

[73] Assignee: RCA Corporation, New York, N.Y.

[21] Appl. No.: 78,795

[22] Filed: Sep. 25, 1979

[51] Int. Cl.$^3$ ............................................. H01L 21/306
[52] U.S. Cl. ........................................ 156/628; 134/4; 156/638; 156/657; 156/662; 252/79.3
[58] Field of Search ................ 134/2, 3, 4, 28, 39–41; 156/628, 635, 662, 638, 657; 252/79.2, 79.3, 79.4; 427/93, 337, 352, 399

[56] References Cited

U.S. PATENT DOCUMENTS

| | | | |
|---|---|---|---|
| 2,822,250 | 2/1958 | Nobel | 156/628 |
| 3,102,061 | 8/1963 | Thornhill | 156/662 X |
| 3,224,904 | 12/1965 | Klein | 134/4 |
| 3,813,311 | 5/1974 | Beck et al. | 156/651 |
| 4,026,741 | 5/1977 | Chang et al. | 156/628 |

*Primary Examiner*—William A. Powell

*Attorney, Agent, or Firm*—Birgit E. Morris; Donald S. Cohen; Robert P. Seitter

[57] ABSTRACT

Silicon wafers are cleaned by first immersing them in a film forming solution which reacts with the dirty wafers to form a film on the wafers and then immersing the wafers in a film stripping solution which removes the film. For silicon wafers both the film forming solution and the film stripping solution may be formed from separate aqueous source solutions comprising 49% HF by weight and 70% $HNO_3$ by weight, respectively. The film forming solution comprises 99.1% to 99.5% by volume the HF solution and 0.5% to 0.9% by volume the $HNO_3$ solution. A small quantity of a wetting agent may be present in this solution. The stripping solution comprises 95% to 99% by volume of the $HNO_3$ solution and 5% to 1% by volume of the HF solution. When utilized at room temperature the film forming solution forms a film on the wafers and the stripping solution removes the film with a minimum of attack on the silicon of the main wafer body. This silicon wafer cleaning method is successful with all silicon wafers independent of doping level.

9 Claims, No Drawings

TWO STEP METHOD OF CLEANING SILICON WAFERS

BACKGROUND OF THE INVENTION

1. Field of the Invention

The invention relates to the field of cleaning semiconductor wafers and more particularly to the field of cleaning silicon semiconductor wafers.

2. Prior Art

Freshly sawn, lapped or ground silicon wafers are extremely dirty and must be cleaned, if subsequent electronic device fabrication processes are to be successful. Among the components of the dirt on the wafers are spindle oil; handcream; silicon particles; silicon powder; cooling solution, including wetting agents; lapping and polishing grit; epoxy casting compounds; human fingerprints and possibly other materials. If this dirt is not removed from the wafers, subsequent processing steps are adversely affected.

In attempting to find an adequate cleaning solution for cleaning all types of wafers, the assignee's materials preparation department evaluated more than 50 commercially available compositions. Most wafers can be cleaned in acid baths. However, heavily doped P-type wafers have required 20% hot KOH and even then do not come out really clean. Further, the hot KOH is reported to leach the dopant from the heavily doped P-type wafers. No single commercial cleaning composition was found which would adequately clean all wafers types and doping levels. Even the best materials for a given wafer type often left wafers dirty.

As a means of determining wafer cleanliness, the assignee's material preparation department utilized a swab test comprising dipping a cotton swab in methylene chloride and scrubbing it across the wafer. The wafer was only considered clean if the swab looked clean following the scrubbing of the wafer. Many wafers cleaned in the best prior art cleaners required recleaning because they failed the swab test after their initial cleaning. Recleaning increases production costs and reduces yields because of increased wafer breakage.

The best of the acidic commercial solutions was selected for use in cleaning all wafers except the heavily doped P-type wafers. This solution cleans approximately 4,000 wafers in 18 gallons of cleaning solution before the solution must be discarded. The wafers are immersed in this solution for seven seconds.

An improved wafer cleaning technique is needed which assures the production of clean wafers in an economical manner. A single cleaning system for all wafers is highly desirable, as is one which does not leach the dopant from the heavily doped P-type wafers.

SUMMARY OF THE INVENTION

The above problems of the prior art wafer cleaning solutions are overcome by the present invention through use of a two-step cleaning process. This process will clean all wafer types and does not significantly leach the dopant from heavily doped P-type wafers. This cleaning process is particularly useful with any work damaged surface, but is not restricted to work damaged surfaces.

First, the wafers are treated with a film forming solution which reacts with the wafers and/or the dirt to form a film on the wafer surface. The wafers are preferably then rinsed in deionized water and immersed in a film stripping solution which removes the film formed by the first solution and leaves the wafers clean. Both the film forming solution and the film stripping solution may be formulated from separate aqueous source solutions comprising 49% HF by weight and 70% $HNO_3$ by weight, respectively. The film forming solution preferably comprises 99.1% to 99.5% by volume of the HF source solution and 0.5% to 0.9% by volume of the $HNO_3$ source solution; with 99.3% and 0.7% being preferred, respectively. A small quantity of a wetting agent may be included in this film forming solution. The film stripping solution preferably comprises 1% to 5% by volume of the HF source solution and 99% to 95% by volume of the $HNO_3$ source solution. However, many other stripping solutions can be used if desired.

The wafers to be cleaned are preferably immersed in the film forming solution for about one minute at room temperature, then rinsed in deionized water and immersed in the preferred film stripping solution for approximately one minute at room temperature. After removal from the stripping solution, the wafers are preferably rinsed in deionized water and then dried.

DETAILED DESCRIPTION OF THE PREFERRED EMBODIMENT

In accordance with the preferred embodiment of this invention, work damaged, dirty or even clean silicon wafers to be cleaned are subjected to a three part cleaning process. First, the wafers are inserted in an ultrasonic cleaner containing a cleaning solution such as Chemcrest 5 with a small quantity of Triton X-100 added to it. Triton X-100 is a wetting agent sold by Rohm and Haas. After a minute of ultrasonic cleaning, which removes large particles, the wafers are rinsed in water for one minute. This first cleaning step is not essential, but is used because it prolongs the life of the more expensive solutions used in the second and third steps by removing many particles and some dust from the surface of the wafer.

Second, the still dirty wafers are immersed in a film forming bath which reacts with the wafers to form a film thereon. The exact nature of the reaction is unknown at this time. Thus, the reaction may be only with the wafer, with both the wafer and the dirt, or possibly just the dirt. However, it is believed to involve some reaction with the wafer itself since the film will form even on a clean wafer. Thus, the term "reacts with the wafers" is used to encompass whatever form the reaction in fact takes and the term dirt is used to encompass undesirable materials and objects on the surface of the wafer.

The film forming solution may be mixed from separate aqueous source solutions of 49% HF by weight and 70% $HNO_3$ by weight, respectively. The film forming solution preferably comprises about 0.5% to 0.9% by volume of the nitric acid source solution and about 99.5% to 99.1% by volume of the HF source solution with a small quantity of a wetting agent such as Cold Water All or Triton X-100 added as a wetting agent. The preferred composition for this film forming solution is 0.7% by volume of the $HNO_3$ source solution and 99.3% by volume of the HF source solution, with a minute quantity of Triton X-100 added. This solution is preferably held at a temperature of about 25° C. A satisfactory film is formed on high resistivity "N" and "P" wafers after about fifteen seconds of immersion. About one minute of immersion is needed to form a satisfactory film on heavily doped P-type wafers. Immersion of the high resistivity wafers in the film forming solution for a full minute produces no detected adverse effects. Thus, although different wafer types can be cleaned using different durations of immersion in the film forming solution, it is preferred to always use a one minute immersion in the film former because of the resulting processing simplicity and the assurance that all wafer types will be thoroughly cleaned.

Although immersion of the wafers in the film forming solution is preferred, other treatment techniques such as dipping, spraying or spinning may be used if desired.

After one minute of immersion in this film forming solution, the wafers are removed. This step forms a film on the wafer surface. This film normally appears to be a very dark stain and may be very nonuniform in color. This film is of undetermined chemical composition, but is similar in appearance to the brown stains which have appeared in spots on wafers in the past as a result of improper quenching of etched wafers at the end of a device fabrication etching step. The semiconductor industry has for many years sought to avoid forming these stains because of the additional processing steps needed to remove them. It is believed that upon removal of the wafer from this film forming solution the dirt which was adhering to the wafer has been loosened or removed by chemical reactions involving the film forming solution. The wafers are next preferably rinsed for one minute in deionized water in order to conserve the solutions and maximize their useful life.

As the third step in the cleaning process, the wafers is inserted in a film stripping solution. The film stripping solution preferably comprises 95% to 99% by volume of the $HNO_3$ source solution and 5% to 1% by volume of the HF source solution. This solution reacts with the film covered wafers to remove the film. This solution is preferably kept at a temperature of about 25° C. After one minute of immersion in this film stripping solution, the wafers are removed, rinsed in deionized water and dried. Following the completion of this step, the wafers are clean and hydrophobic.

The composition of the film stripping solution is not critical. Any of a vast number of solutions will do the job, including a solution comprising 20 vol% HF and 80 vol% $HNO_3$. However, if strong etchants (including 20% HF/80% $HNO_3$) are used, the one minute immersion time must be shortened if the removal of large quantities of silicon is to be prevented.

The ability of this system to function with the wafers held in each of the solutions for one minute makes it ideal for mechanized transfer systems, since the wafers can be indexed simultaneously at all stages of the cleaning. Further, the one minute immersion times make the insertion and removal times of the wafer holders a nonsignificant factor in the process. The prior art system where wafers could only remain in the cleaning tank for seven seconds was not amenable to mechanized operation and made insertion and removal times a significant portion of the process time.

Wafers processed in accordance with the above preferred embodiment, universally pass the swab test for wafer cleanliness.

It is desirable to control the nitric acid content of the film forming solution quite accurately. Although a broader composition range may be useful in some circumstances, it is preferred that the nitric acid source solution comprise 0.7%±0.2% by volume of the mixture. It is preferred that the nitric acid content be between 0.6% and 0.8% and preferably 0.7%±0.05%. A concentration of 0.7% is considered ideal. At this concentration, a very dark stain is formed on the silicon wafer. Too much nitric acid results in the removal of too much silicon. Too little nitric acid causes the film to form more slowly and can leave dirt on the wafers, thus making the cleaning process ineffective. Since $HNO_3$ is volatile, it may be necessary to add small quantities of $HNO_3$ to the bath periodically to maintain the $HNO_3$ concentration at its desired value.

With the prior art cleaning solutions which the assignee previously utilized, it was very important that the wafers be kept wet prior to cleaning because upon drying-out many of the contaminants on the wafer became much harder to remove. This is not necessary when the present cleaning technique is used. However, if desired, the wafers may be kept wet at least until after they have been removed from the film forming solution.

If desired, once the film has been formed on the wafer, the wafer may be stored in that condition and only immersed in a stripping solution when the wafer is about to be processed further for the preparation of semiconductor devices therein.

Both the film forming and film stripping solutions are preferably maintained at temperatures between about 18° C. and about 37° C. during the cleaning process with a range of 30° C. to 36° C. preferred. The lower limit of 18° C. is established when the preferred 0.7% nitric acid solution is used because an adequate film is not formed in one minute at temperatures below 18° C. The upper limit of about 37° C. on the solutions' operating temperature is chosen in the interest of limiting the rate of material removal from the wafer surfaces. Higher temperatures may be used if the rate of material removal is considered unimportant or if a high rate is desired. When utilized in the preferred manner, this cleaning process does not change the surface contours of the wafer.

Both the film forming and the film stripping reactions are exothermic. Thus, if large quantities of wafers are treated, some cooling may be needed to keep the temperatures within the preferred temperature range.

With this system one 18 gallon charge of film forming solution and one 18 gallon charge of film stripping solution has been used to clean more than 12,000 three inch diameter silicon wafers when none of the wafers were heavily doped P-type. However, when heavily doped P-type wafers are cleaned along with wafers having other doping levels, the useful life of the solutions was found to be about 8,000–8,500 wafers per 18 gallon charge of each solution. With a 12,000 wafer capacity, this cleaning system is less expensive per wafer than the previous system. With an 8,000–8,500 wafer capacity, this system is slightly more expensive per wafer than the previous system. In either situation, this system is much more cost effective than the prior art system because it much more reliably produces truly clean wafers. This eliminates the problem of dirty wafers and the added costs of recleaning those wafers which were not clean.

This cleaning process removes all contaminants such as spindle oil, handcream, silicon particles, silicon powder, sawing coolant, wetting agents, lapping and polishing grit, epoxy casting compounds, fingerprint and whatever other dirt is on the wafers. This is accomplished without significantly leaching highly doped P-type wafers and without other adverse effects.

The particular times of immersion in the film forming and the film stripping solutions are selected to encompass the worst case needs for the hardest to clean wafers. These times may be adjusted in accordance with the characteristics of the wafers being cleaned.

When utilized in accordance with the preferred embodiment, this cleaning process removes about 0.1 to 0.2 mils of material from each side of the wafer.

Many different compositions may be utilized as the film stripping solution since the cleaning process is much less sensitive to the composition of the stripping solution than it is to the composition of the film forming solution.

The preferred solution compositions and solution operating temperatures are in part selected with an eye to forming the film in a reasonable time, minimizing the removal of material from the substrate and of maximizing solution useful life. If such considerations are not important, or if it is desired to remove additional material from the wafer surfaces, then other temperatures and solution compositions may be utilized.

An improved system for cleaning wafers has been described. Those skilled in the art will be able to vary the details of the preferred embodiments without departing from the scope of the invention as defined in the appended claims.

What is claimed is:

1. A method of cleaning a dirty silicon semiconductor wafer comprising:
   intentionally exposing the wafer to an environment which reacts with the wafer to form a dirt removing film on the wafer, said environment being a film forming solution initially comprising effectively:
   99.1%–99.5% by volume of an aqueous source solution of 49% by weight HF; and
   0.5%–0.9% by volume of an aqueous source solution of 70% by weight $HNO_3$; and
   subsequently removing said film in order to leave a clean wafer surface.

2. The method recited in claim 1 wherein:
   said film forming solution includes a wetting agent.

3. The method recited in claim 1 wherein:
   said film forming solution comprises effectively 0.7%±0.05% by volume of said $HNO_3$ source solution.

4. The method recited in claim 1 wherein said removing step comprises:
   treating said wafer with a film stripping solution initially comprising effectively:
   80%–99% by volume of said source solution of $HNO_3$; and
   1%–20% by volume of said source solution of HF.

5. The method recited in claim 4 wherein said stripping solution initially comprises effectively:
   95%–99% by volume of said source solution of $HNO_3$; and
   1%–5% by volume of said source solution of HF.

6. The method recited in claim 5 wherein said stripping solution initially comprises effectively:
   substantially 95% by volume of said source solution of $HNO_3$; and
   substantially 5% by volume of said source solution of HF.

7. A method of cleaning a dirty silicon semiconductor wafer comprising:
   intentionally exposing the wafer to an environment which reacts with the wafer to form a dirt removing film on the wafer, said environment being a film forming solution initially comprising effectively:
   99.1%–99.5% by volume of an aqueous source solution of 49% by weight HF; and
   0.5%–0.9% by volume of an aqueous source solution by 70% by weight $HNO_3$; and
   subsequently removing said film in order to leave a clean wafer surface, said removing being accomplished by treating said wafer with a film stripping solution initially comprising effectively:
   95%–99% by volume of said source solution of $HNO_3$; and
   1%–5% by volume of said source solution of HF.

8. The method recited in claim 7 wherein:
   said film forming solution comprises 0.7%±0.5% by volume of said $HNO_3$ source solution.

9. The method recited in claim 5 wherein:
   said exposing is for a period of about one minute; and
   said treating is for a period of about one minute.

* * * * *